(12) United States Patent
Laube

(10) Patent No.: US 6,230,895 B1
(45) Date of Patent: May 15, 2001

(54) CONTAINER FOR TRANSPORTING REFURBISHED SEMICONDUCTOR PROCESSING EQUIPMENT

(76) Inventor: David P. Laube, 5910 E. Julep, Mesa, AZ (US) 85205

( * ) Notice: Subject to any disclaimer, the term of this patent is extended or adjusted under 35 U.S.C. 154(b) by 0 days.

(21) Appl. No.: 09/642,051

(22) Filed: Aug. 16, 2000

Related U.S. Application Data
(60) Provisional application No. 60/150,064, filed on Aug. 20, 1999.

(51) Int. Cl.[7] .................................................. B65D 85/00
(52) U.S. Cl. ........................................... 206/710; 206/454
(58) Field of Search ..................................... 206/710, 719, 206/722–724, 525, 308.1, 493, 454, 303, 524.8, 832; 220/4.21, 4.28

(56) References Cited

U.S. PATENT DOCUMENTS

| | | | |
|---|---|---|---|
| 3,596,822 | * 8/1971 | Holley | 206/303 |
| 3,615,006 | * 10/1971 | Freed | 206/710 |
| 4,564,880 | * 1/1986 | Christ et al. | 206/724 |
| 4,609,103 | * 9/1986 | Bimer et al. | 206/454 |
| 4,846,343 | * 7/1989 | Rupert | 206/303 |
| 6,036,007 | * 3/2000 | Alejandro et al. | 206/493 |

* cited by examiner

Primary Examiner—Luan K. Bui

(57) ABSTRACT

A pressurized container for transporting cleaned semiconductor processing equipment wherein a shell of static-free material is provided with a central pedestal covered by a deformable pad and a number of vertical stops and shoulders spaced therefrom. The equipment is clamped in place on the stops and pedestal and a cover positioned on the shell. The shell contains input and output ports to permit a gaseous purge followed by a closing of the output port to build pressure in the container followed by closure of the input port to provide a positive pressure in the container.

14 Claims, 4 Drawing Sheets

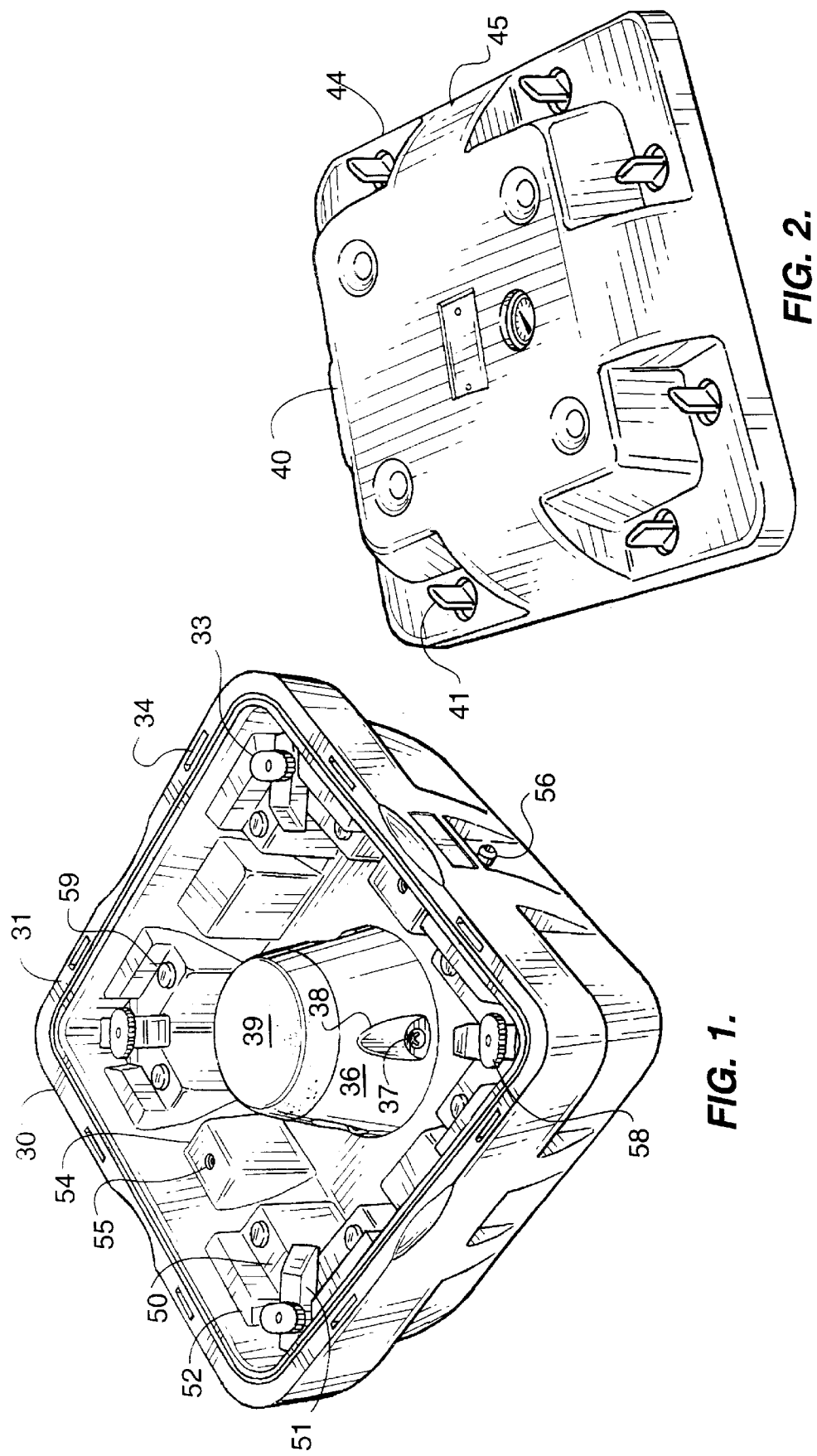

CONTAINER FOR TRANSPORTING REFURBISHED SEMICONDUCTOR PROCESSING EQUIPMENT

CROSS REFERENCE TO RELATED APPLICATION

The present application is based on provisional patent application Ser. No. 60/150,064 filed on Aug. 20, 1999.

BACKGROUND OF THE INVENTION

This invention relates to a container for transporting cleaned semiconductor processing equipment and, in particular, a pressurized container for maintaining such equipment in a fixed position during transport. Significant advantages of the invention are to reduce the opportunity for particle generation arising from movement of the equipment in the container and to eliminate contamination of the refurbished equipment by the entry of outside contaminants. Contamination of cleaned equipment during transport is likely to result in defects in the semiconductor products made in the equipment when again placed in operation.

In the manufacture of semiconductor products, a large diameter wafer is typically subjected to a number of processing steps. Among these steps are processes that sequentially add and remove materials from the wafer surface as well as implanting or defusing material into the wafer itself. The steps include the deposition of materials within a closed chamber onto the exposed surfaces of a masked wafer. While the portion of the wafer surface receiving the transported materials is well outlined, the movement of material from source to wafer is not fully controlled with the result that portions of the processing equipment adjacent the wafer target receive a deposit of material thereon. The deposited material initially adheres to the equipment, however, continued operation results in a buildup on the equipment. This buildup is not controlled and therefore often is non-uniform with the result that flaking and spalling can take place. To improve manufacturing yield, the equipment is periodically taken out of use, disassembled and the various parts transported to a cleaning facility. At this facility the parts are etched in a bath and otherwise cleaned to the original level of cleanliness. The particular cleaning process varies with the type of material being deposited.

The initial cleaning steps are concerned with removal of deposited masses of material and need not be performed in a clean room environment. However, the final preparation steps and the individual packaging of cleaned parts are carried out in a clean room environment, typically a class 100 room, where the quantity of airborne particles per unit volume is strictly controlled. Again the objective of the cleaning process is to return the parts to the manufacturing environment with a cleanliness factor that meets an objective standard so as not to reduce the manufacturing yield when returned to service.

The ever increasing complexity and reduction in size of semiconductor devices has made the manufacturing yield more important. Defects in an integrated circuit affect the operation of the circuit and render it unsuitable for reliable use. Circuits testing not up to standard are immediately discarded with little or no salvage value. Thus, the delivery of clean components to the reassembly point is a very important step in controlling yield.

Typically, after the physical removal of deposited materials, the equipment parts are transported in a water environment to the final packaging area. The components are usually wiped down and dried in an oven with a nitrogen environment. Packaging of the individual parts is conducted in a clean room. Each part is individually packaged for reassembly in the clean room of the manufacturing facility. The packaging of the individual components adds considerable cost to the cleaning process and delays the return of the equipment to manufacturing use.

Accordingly, the present invention is directed to a container for transporting assembled semiconductor processing equipment from the cleaning facility to the manufacturing user, thereby enabling the assemblage to be constructed in the clean room of the treatment facility and later opened in the clean room of the manufacturing facility. To avoid particle generation during transport, the container is provided with means for maintaining the relative position of the assemblage so that movement and incidental contact does not take place in the container. Furthermore, the container is constructed to permit a purge by an inert gas followed by an elevation of internal pressure to essentially eliminate the entry of contaminates from external sources during transport. After transport to the user facility, the exterior of the container is cleaned and the unopened container taken directly into the clean room.

SUMMARY OF THE INVENTION

The container of the present invention accommodates a large area planar assembly of the type used in the deposition of materials on semiconductor wafers wherein a central aperture in the assembly is used for positioning the target wafer during deposition of material. The container includes a shell of a static dissipative material so as to reduce the likelihood of attracting particles thereon. The shell has a bottom wall and side walls extending upwardly therefrom with a pedestal centrally located on the shell bottom. A deformable cap of expanded plastic such as a molded PTFE pad is located on the pedestal. The cap has a diameter at least as large and preferably greater than the diameter of the central aperture in the refurbished equipment. Vertical stop means is affixed to the side walls of the outer shell and may comprise a plurality of stops located at substantially equal distances about the pedestal for supporting the equipment. When placed in the container, the equipment rests on the stop means and the deformable cap. At least one clamp is located in the container for securing the equipment against the vertical stop means so as to prevent movement in the shell.

Input and output ports are located in the sidewall of the shell to permit the flow of gas therethrough. When the cover which is dimensioned to be received on the outer shell is in place, sealing means interposed between cover and shell provides an airtight seal. The placement of the cover on the outer shell is followed by a purge of an inert gas using the input and output ports and an external gas supply. When the purge is completed, the output port is closed and the gas is continually injected to produce a positive pressure at a desired level. Next, the input port is closed and the gas source is decoupled.

The placement of the large area planar assembly in the container takes place in the clean room of the cleaning facility so that the opportunity for particles to adhere to the assembled equipment is essentially eliminated. The closure followed by the purging and building of positive pressure also occur in this clean room environment so that an assembled piece of processing equipment can be delivered to the manufacturing facility. Exterior cleaning of the container precedes the opening and installing of the equipment. The need for an individual packaging of components to maintain the clean state during transport is obviated. Further features and advantages of the invention will become more readily apparent from the following detailed description of a preferred embodiment when taken in conjunction with the accompanying drawings.

BRIEF DESCRIPTION OF THE DRAWING

FIG. 1 view in perspective of the preferred embodiment of the invention showing the outer shell and its contents.

FIG. 2 is a view in perspective showing the cover dimensioned to be received on the outer shell.

FIG. 7 is expanded view of a clamp in FIG. 6

DESCRIPTION OF THE PREFERRED EMBODIMENT

Figure 3:
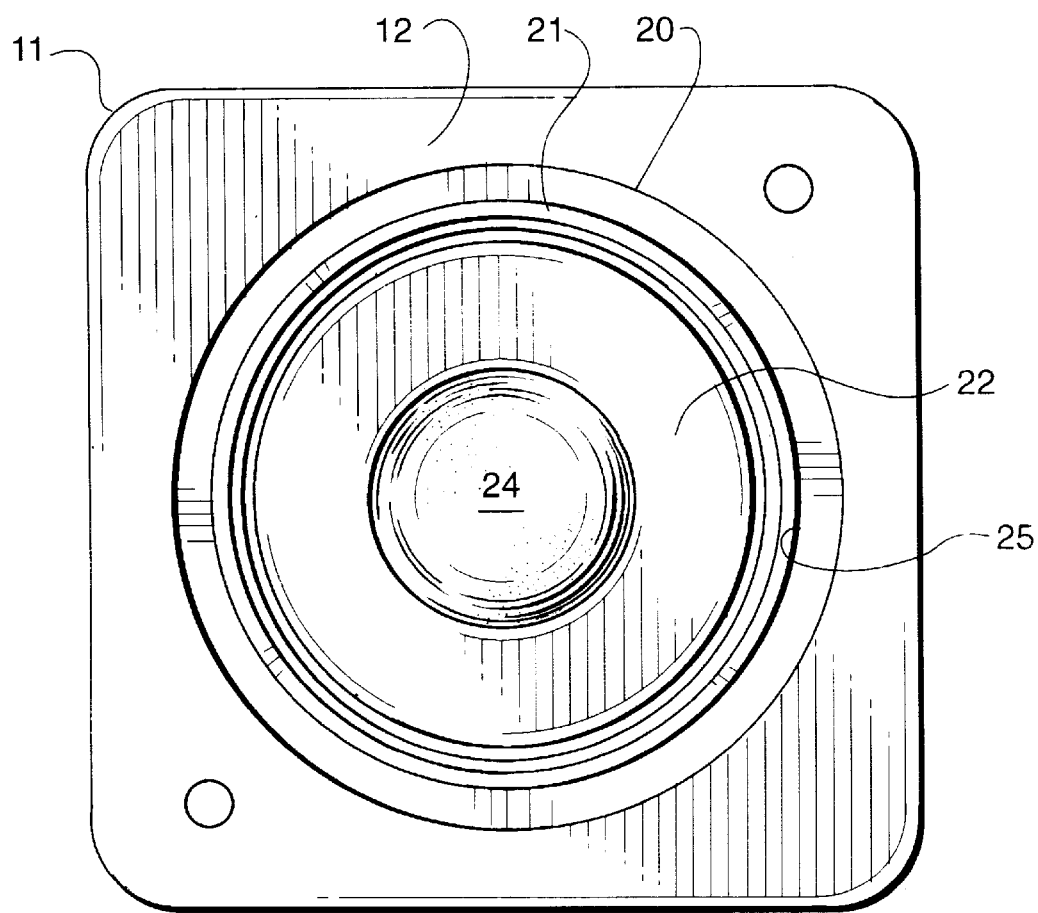
FIG. 3 is a plan view of a typical adapter plate assembly used in sputtering material on a semiconductor wafer.
Figure 4:
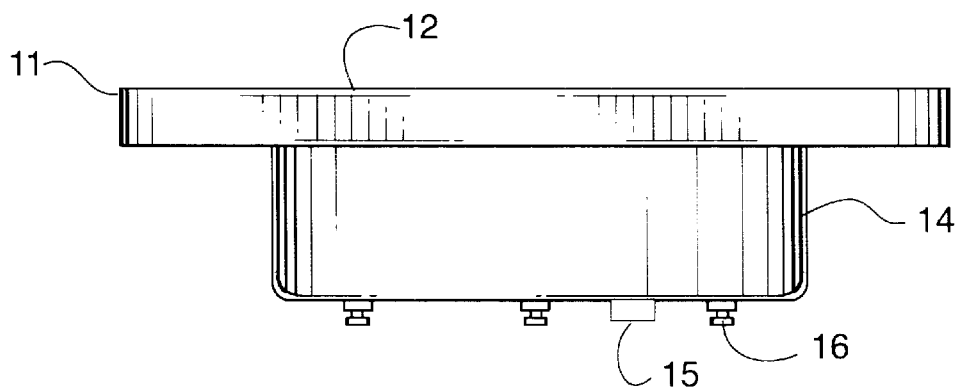
FIG. 4 is A side view of the adapter plate assembly of FIG. 3.

Referring first to FIGS. 3 and 4, a typical adapter plate assembly of the type used for in the sputtering of metals such as titanium on a semiconductor wafer is shown as an assemblage. The semiconductor product manufacturer having previously used the equipment for repeated deposition operations removes the adapter plate assembly including the internal shielding and clamp ring from the body of the equipment for removal of deposited material. The assemblage is typically broken down into its constituent parts and all are subjected to etching solvent baths followed by various drying and surface preparation steps at a remote location. These activities may be initiated in a moderately controlled environment, but the finishing steps of the cleaning process occur in a clean room environment in order to enhance particle removal. Reassembly occurs in the clean room environment. Since these processes are carried out normally by third party contractors, the cleaned equipment is shipped back to the user. In cases where the user has a sufficiently large facility and conducts its own cleaning operations, the site of these operations are usually removed from the work place so that similar shipping considerations apply.

The adapter plate assembly 11 comprises a base plate 12 having a centrally located circular groove 20 formed on its upper surface. The smaller diameter body 14 of the assembly contains the shield and clamping mechanism for receiving the semiconductor wafer used as the deposition target. The surround which rests in groove 20 upon the upper plate 12 and extends upwardly to contain the sputtered material during operation is not part of the assemblage shown. A DC bias hub 15 is provided to facilitate connection to an external power source during operation. Shield 22 depending downwardly from the base plate contains the central aperature 24 against which the wafer is urged during the deposition process. A clamp shield ring 21 maintains the shield 22 in position and is secured to the plate 12 by threaded fasteners. As will be noted in FIG. 5, the shield 22 is affixed to clamp ring by bolts 25. The configuration of the piece parts shown in FIGS. 3 and 4 are merely illustrative and several variants thereof are used by equipment manufacturers. The significant feature is that the piece parts define a central aperature 24 which receives a semiconductor wafer positioned there beneath. As a result, material from the overlying source encounters not only the exposed surfaces of the wafer but also deposits residue on proximate piece parts of the assemblage.

Present day practices call for individually packaging the nine or more individual parts of the adapter plate assembly after cleaning. The individual packages are returned to the user for assembly at his facility. This practice is followed due in part to the fact that an effective transport container for an assembled plate assembly is not presently available. The container shown in FIGS. 1 and 2 receives the adapter plate assembly, secures it against movement during transport and maintains a positive pressure inert environment therein to guard against the introduction of particles during transport. Turning now to FIGS. 1 and 2, the novel container is shown comprising the shell 30 and a mating cover 40. The shell and cover are rigid single walled elements made of a static dissipative material, for example carbon fiber plastic having a resistivity in the range of $10^9$ to $10^{12}$ ohms per centimeter. The two parts can be manufactured by transfer molding. In the mating surface 31 of shell 30 a groove or recess is provided to accommodate gasket 33. The gasket is a flurosilicon O-ring to provide an airtight seal between cover and shell upon closure. The shell is provided with a plurality of vertical slots 34 which are positioned to receive the prongs of latches 41 located on cover 40. Alternatively, a hinged attachment to provide a captive lid as shown in FIG. 5 can be utilized if desired.

A pedestal 36 centrally located on the bottom of the shell is shown removably attached by threaded fasteners 37. A deformable expanded plastic cap 38 is shown positioned on the top of the pedestal. The cap is a molded plastic cap with a polytetrafluroethylene (PTFE) outer layer 39. The cap can be placed on the pedestal or adhered to the top of the pedestal. By using expanded plastic which is doped to be conductive, a static charge build-up between the container and the cleaned adapter plate assembly, is essentially eliminated. The cap is deformable and makes contact with the inner edge and the underside of the assemblage. The diameter of the cap is shown greater than the diameter of central aperture 24 of the plate assembly. The center portion of the plate assembly is thus supported during transport. A plurality of vertical stops 50 are molded into the side wall of the shell of the embodiment of FIG. 1. The stops are located about the pedestal for supporting the outer edge of the plate assembly. Overlying clamps 51 are available to bring pressure against the upper surface of the plate assembly by tightening the corresponding threaded bolt 58. This arrangement guards against vertical movement during transport. Lateral movement within the container is inhibited by the shoulder 52 of a stop. The clamps, the shoulders and the stops are fabricated from the same material used for the shell with the shoulders and stops preferably formed integral with the shell. When the plate assembly is positioned on the pedestal in the shell in the attitude shown in FIG. 3, multiple areas of support are provided and the opportunity for vertical or lateral movement of the equipment is eliminated. Small pads 59 of PTEE material can be secured to the stops to aid in the loading and unloading of the cleaned assembly.

A pair of gas channel abutments 54 are molded in the shell and are located on opposing sidewalls. Each abutment contains a passage therein which extends between an internal port 55 and an external port fitted with a coupler 56. Each coupler contains a valve that can be opened and closed by rotation. When the assembled equipment is placed in the shell, secured by the clamps and the cover is affixed thereto, the couplers 56 are rotated to the open position and one coupler is attached to an external supply of dry gas, typically nitrogen. The flow of gas is used to purge the container. After a purge, the coupler providing the output flow is closed and the input stream is continued until the internal pressure is about 2–4 psia at 70° F. The pressure gauge 44 in the cover indicates if leakage and contamination have taken place during transport and a further cleaning operation is required before placing the transported assemblage in operation.

Figure 5:
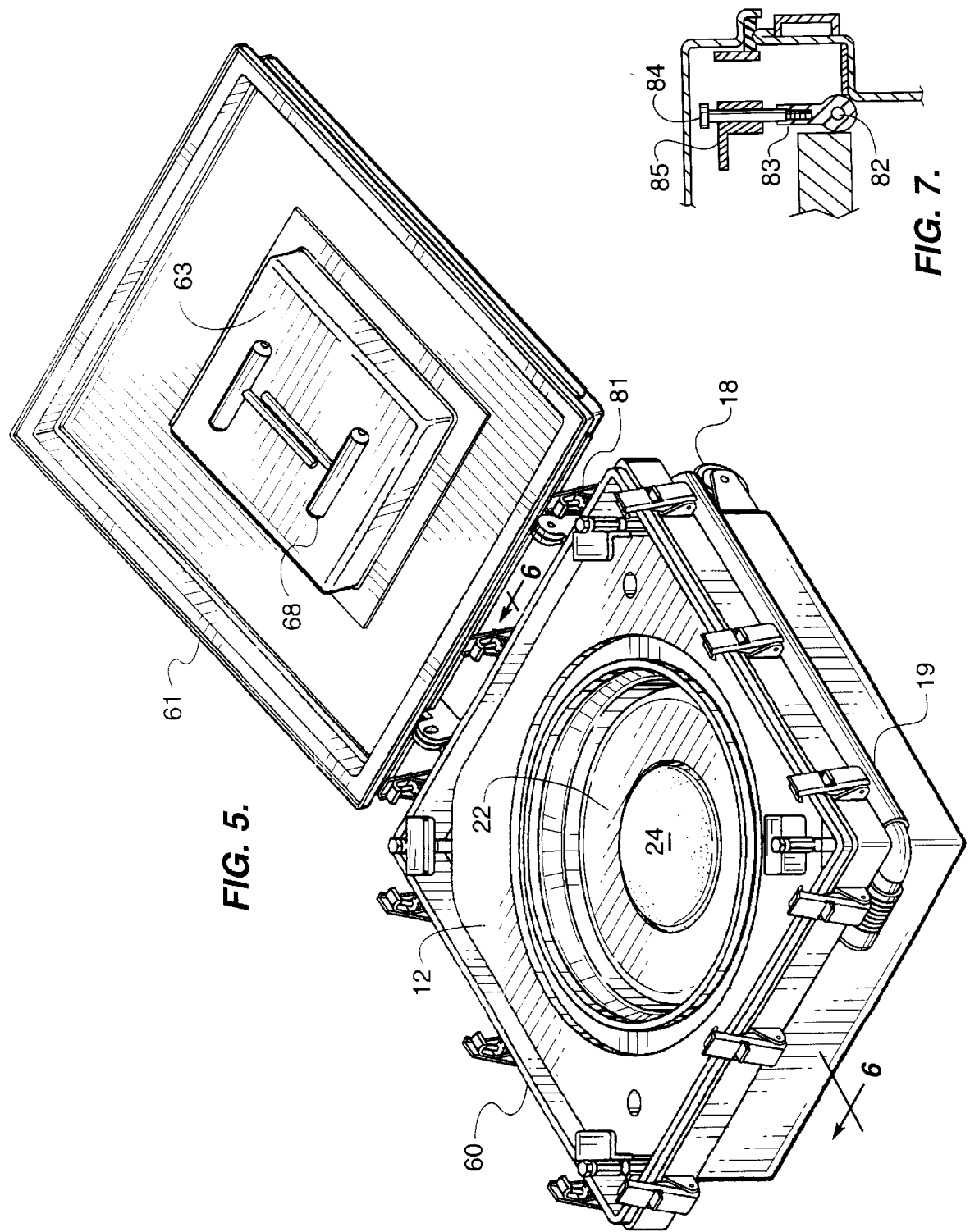
FIG. 5 is Perspective view of another embodiment of the invention.
Figure 6:
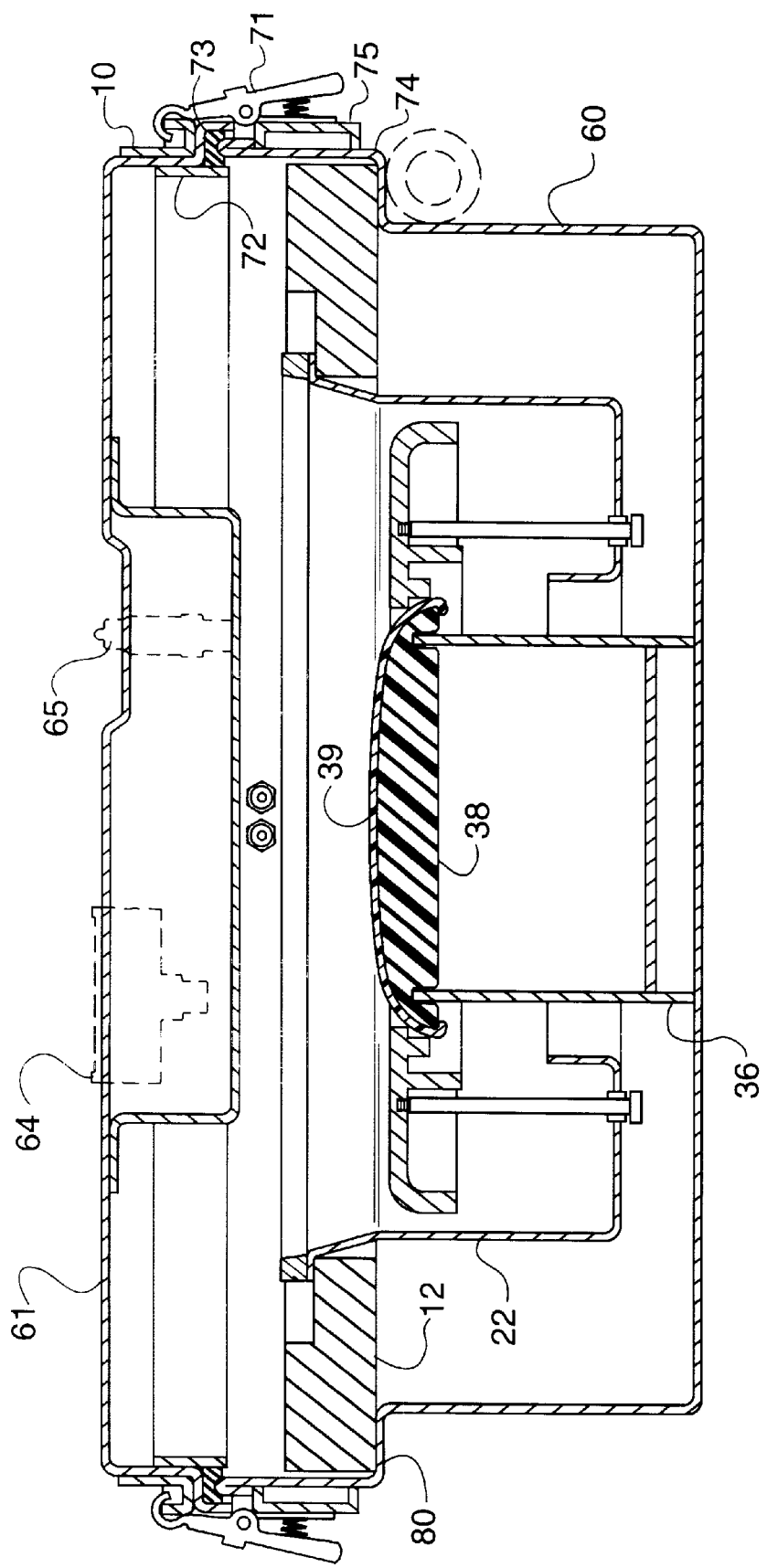
FIG. 6 is a cross section taken along line 6—6 of FIG. 5

Another embodiment of the invention is shown in FIGS. 5 and 6 wherein the bottom portion 60 of the container is provided with a hinged lid. As seen in FIG. 5, a typical planar assembly including base plate 12 with shielding 22 and aperture 24 is supported in bottom portion 60. The cover 61 is provided with a central container 63 within which is located pressure gauge 64 and pressure relief valve 65. On the inner wall of container 63 are recesses which removably receive a pair of handles 68 (shown in FIG. 5), which are used for threaded engagement with mating holes in base plate 12 to facilitate withdrawal from the container without contamination. At the time of the cleaning of the assemblage, the container is subject to a similar cleaning process so that the handles are clean at the time of opening the container.

The container cover is provided with a peripheral flange 70 which engages a number of clamps 71 affixed to the container bottom. The cover contains a retaining ring 72 for the sealing gasket 73 which contacts the side wall 74 upon closure. The bottom external band 75 extends about the periphery of the bottom to provide a base for the affixation of clamps 71.

The container bottom is formed with an internal peripheral flange 80 which serves as the vertical stop means for base plate 12. The base plate has rounded corners as shown in FIG. 3 which provides clearance between the corners of the base plate and the container sidewalls. The vertical clamping means comprises an adjustable rotatable clamp 81 located at each corner of the bottom. The details of the clamp 81 are shown in FIG. 7 wherein shaft 82 has an elongated arm 83 mounted for rotation thereon. The ends of the shaft are held in the adjacent side walls of the container. The arm 83 has a threaded socket for receiving bolt 84. Retaining arm 85 moves vertically with bolt 84 and contacts the top surface of the base plate 12. Pivoting of the clamp 81 outwardly permits ready withdrawal of the assemblage from the open container.

The deformable cap of expanded plastic 38 is shown in the cross sectional view of FIG. 6 with the PTFE cap 39 thereon. In this embodiment, the cap is provided with a circular groove which conforms to the pedestal 36. Thus, the cap can be removed and replaced after each use. The diameter of the deformable cap is shown slightly greater than that of the aperture in shield 22. As a result, the shield contacts the edge of the cap and is supported thereby. Thus, the assemblage in the container is supported both at the inner and outer peripheral regions. Since the dimensions of and manner of shielding in an assemblage may vary, the diameter of the deformable pad can be increased for larger apertures. The length of the shielding is not particularly important since substantial clearance is provided between the bottom of the container and peripheral flange that receives the base plate thereon. To assist in movement of the container when loaded with the assemblage, the container can be provided with wheels 18 and a handle 19. While the foregoing description has referred to two embodiments of the invention, it is recognized that many modifications and variations may be made therein without departing from the scope of the invention.

What claimed is:

1. A container for transporting refurbished semiconductor processing equipment of the type containing a large area planar assembly having a central aperture for positioning a semiconductor target during deposition of materials thereon, said container comprising:

a) an outer shell having a bottom and sidewalls extending upwardly therefrom;

b) a pedestal centrally located on the bottom of the shell;

c) a deformable cap located on the pedestal, said cap having a diameter at least as large as the diameter of the central aperture.

d) vertical stop means affixed to the sidewalls of the outer shell and spaced from the pedestal for supporting the equipment in the shell;

e) clamp means affixed to the sidewalls of the outer shell for securing the equipment against movement in the shell;

f) input and output ports located in the sidewalls of the shell to permit the flow of gas therethrough, said ports having open and closed positions; and g) a cover dimensioned to be received on the outer shell in sealing engagement therewith.

2. The container in accordance with claim 1 wherein said deformable cap has a diameter greater than the diameter of the central aperture.

3. The container in accordance with claim 2 wherein said outer shell is of generally rectangular shape and said clamp means comprises four clamps located in diagonally opposed positions.

4. The container in accordance with claim 3 wherein said clamps are vertically adjustable to urge the planar assembly against the vertical stop means.

5. The container in accordance with claim 2 wherein said deformable cap is removably attached to the pedestal.

6. The container in accordance with claim 5 wherein said deformable cap is made of an expanded plastic.

7. The container in accordance with claim 6 wherein said deformable cap has an outer layer of polytetrafluorothylene thereon.

8. The container in accordance with claim 7 further comprising sealing means interposed between the cover and the shell, said ports enabling the purging of the container and establishing a positive pressure therein.

9. The container in accordance with claim 2 wherein said vertical stop means comprises a plurality of vertical stops affixed to the sidewalls of the outershell and located substantially equidistant about the pedestal.

10. The container in accordance with claim 9 wherein said clamp means comprises a plurality of clamps each located at one of said plurality of vertical stops.

11. The container in accordance with claim 10 further comprising a sealing member interposed between the cover and the shell.

12. The container in accordance with claim 3 wherein said vertical stop means comprises an internal flange extending about the periphery of the shell.

13. The container in accordance with claim 12 wherein said clamps are mounted for rotation to facilitate removal of the equipment from the container.

14. The container in accordance with claim 13 wherein said ports are gas ports for purging the container and establishing a positive pressure therein.

\* \* \* \* \*